United States Patent [19]

Cachier

[11] Patent Number: 5,313,693
[45] Date of Patent: May 24, 1994

[54] DEVICE FOR THE MOUNTING OF VERY WIDE-BAND MICROWAVE INTEGRATED CIRCUITS

[75] Inventor: Gérard Cachier, Bures sur Yvette, France

[73] Assignee: Thomson-CSF, Puteaux, France

[21] Appl. No.: 970,632

[22] Filed: Nov. 3, 1992

[30] Foreign Application Priority Data

Dec. 6, 1991 [FR] France .................. 91 15165

[51] Int. Cl.⁵ .............................. H01G 4/00
[52] U.S. Cl. ................ 29/25.03; 29/25.02; 437/206; 437/209; 437/211; 437/217
[58] Field of Search ............ 29/25.03, 25.02; 437/206, 209, 211, 217

[56] References Cited

U.S. PATENT DOCUMENTS

| | | | |
|---|---|---|---|
| 5,002,895 | 3/1991 | LaParquier et al. | 437/206 |
| 5,023,189 | 6/1991 | Bartlow | 437/209 |
| 5,063,177 | 11/1991 | Geller et al. | 437/209 |
| 5,068,714 | 11/1991 | Seipler | 437/209 |
| 5,200,362 | 4/1993 | Lin et al. | 437/211 |

FOREIGN PATENT DOCUMENTS

| | | |
|---|---|---|
| 0001890 | 5/1979 | European Pat. Off. . |
| 63-232421 | 9/1988 | Japan . |
| 1241848 | 9/1989 | Japan . |
| 3124050 | 5/1991 | Japan . |

*Primary Examiner*—Brian E. Hearn
*Assistant Examiner*—Kevin M. Picardat
*Attorney, Agent, or Firm*—Meltzer, Lippe, Goldstein, Wolf, Schlissel & Sazer

[57] ABSTRACT

The integrated circuit chips (5) are mounted on a ferrite support (20). The ferrite support is metallized uniformly (26) on its lower face and bears metallization zones (21, 24) on its other face. To certain of these zones (24) serving as a ground plane, there are attached the integrated circuit chips (5). The other zones (21) act as relays to connect the supply voltages that are applied by means of a linking wire (7') and a thin film decoupling capacitor (10, 11, 12) borne by the chip. The ground zones (24) are connected to the general ground plane (26) by metallized holes (25). The linking wire (7') is positioned so as to face a bared part of the ferrite to prevent any parasitic resonance.

3 Claims, 2 Drawing Sheets

DEVICE FOR THE MOUNTING OF VERY WIDE-BAND MICROWAVE INTEGRATED CIRCUITS

BACKGROUND OF THE INVENTION

The present invention relates to a device for the mounting of very wide-band microwave monolithic integrated circuits, notably GaAs circuits.

Wide-band microwave monolithic integrated circuits such as GaAs circuits are much used in equipment that has to work in very wide bands, for example of 2 to 20 GHz or more. GaAs circuits improve performance characteristics notably because of the uniformity of the gain obtained, and they enable a diminution of volume and a reduction of the batch production prices. These advantages are further accentuated in very wide passband applications by the use of the distributed amplifiers technique, providing simultaneously for high gain, a very wide band, low reflection coefficients at input and at output, and efficient input/output insulation.

However, these integrated circuits should be provided with circuits for the isolation or decoupling of the supply or bias circuits. Now, these decoupling circuits use capacitors to decouple the supplies used to bias the amplifiers, and the lower the frequencies at which it is sought to work, the greater should be the capacitance value of these capacitors (and hence the greater should be their size). These capacitors therefore take up a great deal of semiconductor surface area, thus preventing as great a reduction in cost and in space requirements as might have been hoped for. In practice, it is not sought to achieve decoupling at frequencies below 5 GHz so as not to excessive penalize the size of these chips and manufacturing output, for the manufacturing output levels of capacitors made in thin layers are not very great.

If it is sought to work at lower frequencies than 5 GHz, in the case of very wide band applications, then a known approach consists in complementing the decoupling with very external capacitors of very high capacitance value made on an attached support bearing the integrated circuits. This support may be a metal support with attached capacitors or a conductive silicon support on which MOS (metal-oxide-semiconductor) capacitors are made.

A drawback of this approach is, however, the appearance of a resonance due to a capacitor on integrated circuit/linking wire/external capacitor system. It is practically not possible to diminish the resonance frequency for this would imply an excessively high value of capacitance on integrated circuit and a very high inductance of the connecting wire, hence an excessive space requirement and problems of parasitic modes for a long connecting wire.

SUMMARY OF THE INVENTION

It is an object of the invention to overcome this drawback by preventing the occurrence of this phenomenon of resonance.

Another object of the invention is a mounting device that eliminates the drawback of the known approach through the use of a ferrite support.

According to the invention, there is therefore provision for a device for the mounting of very wide-band microwave monolithic integrated circuits comprising a support to which there are fixed the integrated circuit chips which comprise capacitors for the decoupling of the DC supplies of said circuits, said support also bearing means for the connection of said capacitors to said supplies, wherein said support is made of ferrite and wherein said connection means comprise metallized connection zones on the support, connected by linking wires to said decoupling capacitors, said wires being positioned facing bared parts of said ferrite support.

BRIEF DESCRIPTION OF THE DRAWINGS

The invention will be understood more clearly and other features and advantages will appear from the following description and from the appended drawings, of which.

DESCRIPTION OF THE PREFERRED EMBODIMENT

Figure 1:
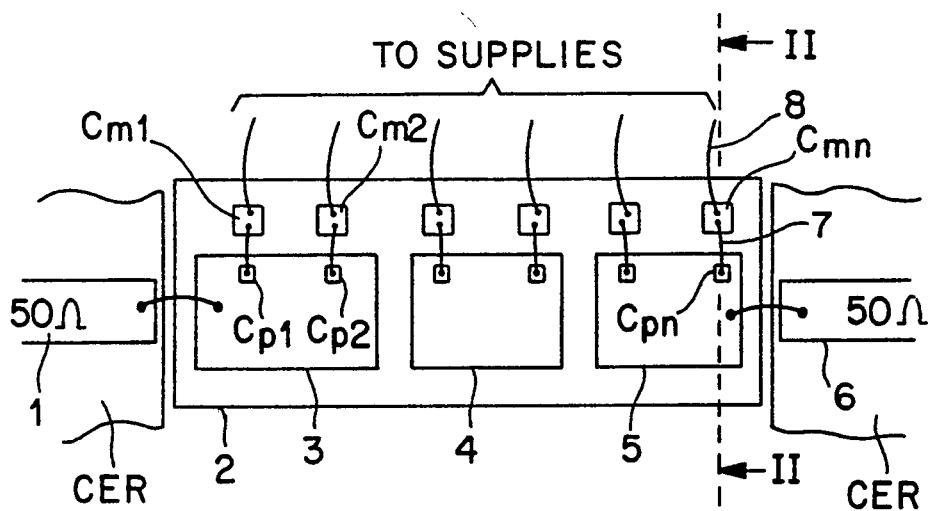
FIGS. 1 and 2 are top and sectional views of a device for mounting in a hybrid circuit according to the prior art.
Figure 2:
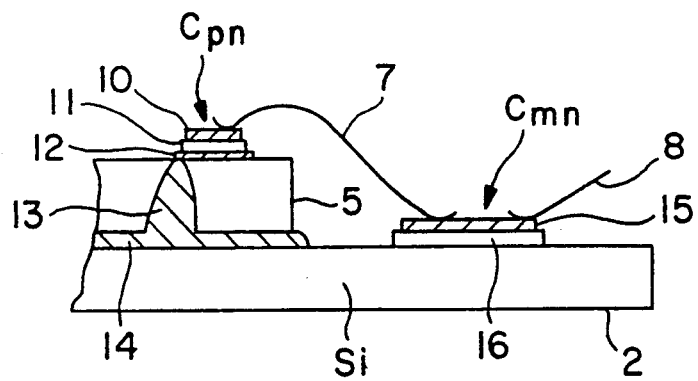

As illustrated in FIGS. 1 and 2, in a known use on a support attached in a hybrid circuit, the GaAs monolithic integrated circuit chips 3, 4, 5 are mounted on a support 2, made of conductive silicon for example. The support is positioned between a microstrip input line 1 and a microstrip output line 2 with impedance equal in a standard way to 50 Ω, made on a ceramic substrate CER. Each chip has decoupling capacitors $C_{p1} \ldots C_{p2} \ldots C_{pn}$ connected by connecting wires such as 7 (thermocompression wire) to external capacitors $C_{m1}, C_{m2} \ldots C_{mp}$, themselves connected to DC supplies (not shown) by connections such as the wire 8 (the references $C_{p1} \ldots C_{p2} \ldots C_{pn}$ and $C_{m1}, C_{m2} \ldots C_{mp}$ are hereinafter applied without distinction to the above-named capacitors as well as to their capacitance values). As can be seen more clearly in FIG. 2, which is a partial sectional view of the device of FIG. 1 along the line II—II, the GaAs chip 5 is mounted by means of its metallized lower face 14 on the conductive silicon support 2. The capacitor $C_{pn}$ made on the chip 5 comprises a dielectric layer 11 included between two metal layers 10 and 12, both these layers being made by thin film technology. The conductive layer 12 is connected connected to the layer 14 acting as a ground for a metallized hole 13. The external capacitor $C_{mn}$ is a MOS type capacitor comprising a metal layer 15, an oxide layer SiO$_2$ 16 and a semiconductor layer constituted by the support 2 acting as a ground. The layer 10 and the layer 15 are connected by a connecting wire 7 (thermocompression wire).

The system formed by the capacitor $C_{pn}$, the linking wire 7 system with inductance L and the capacitor $C_{mn}$ has a resonance at the frequency $f_r$ $$f_r = \frac{1}{2\pi} \sqrt{\frac{1}{L \frac{C_{pn} C_{mn}}{C_{pn} + C_{mn}}}}$$

In practice, for example:

L=0.1 nH $C_{pn} = 20$ pF $C_{mn} = 200$ pF whence:

$f_r = 200$ pF

This value is very difficult to reduce for that would imply the use of a very high-value capacitance $C_{pn}$, an approach ruled out in practice for the reasons already mentioned, and a very high inductance L which would lead to problems of space requirement and parasitic modes for a long thermocompression wire.

Figure 3:
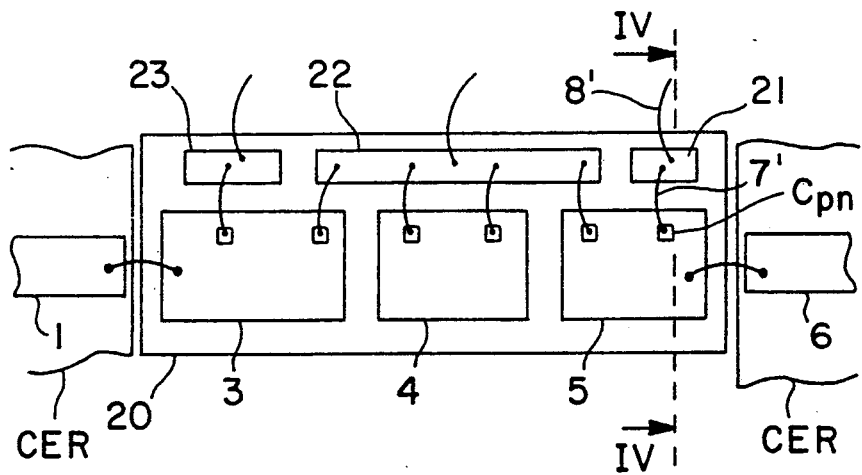
FIGS. 3 and 4 are top and sectional views of the mounting device according to the invention.
Figure 4:
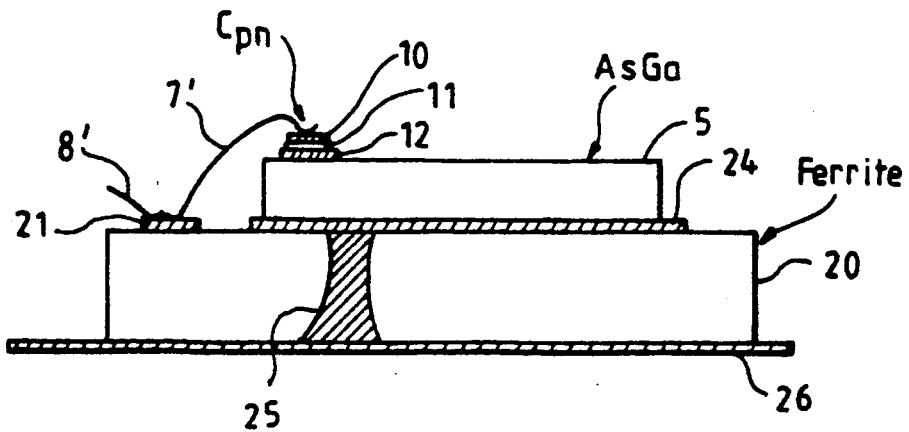

The invention proposes to replace the silicon support 2 with a ferrite support 20 as is shown in FIG. 3 in a top view and in FIG. 4 in a sectional view along the line IV—IV of FIG. 3. The same reference numbers refer to the same elements as in FIGS. 1 and 2. The support 20 has the shape of a small plate with a thickness of some hundreds of micrometers. It is, for example, made of pure nickel ferrite, having low permeability and a maximum resonance frequency (without magnetic field) of 2 GHz. The small plate 20 has a uniform metallization 26 serving as a general ground plane on one of its faces (the lower face in the drawing) and several metallization zones on its other face: some of these zones, such as the zone 24, serve as a ground plane for the chips 3, 4, 5 which are mounted thereon and the others 21, 22, 23 (one or more as the case may be) serve as connection zones for the supply voltages to be applied. Thus the zone 21 is connected to the capacitor $C_{pn}$ by the linking wire 7' and the supply by a wire 8'.

Each upper ground zone such as 24, to which there is attached a GaAs chip, is connected to the general ground plan 26 by one (or more) metallized holes 25.

Figure 5:
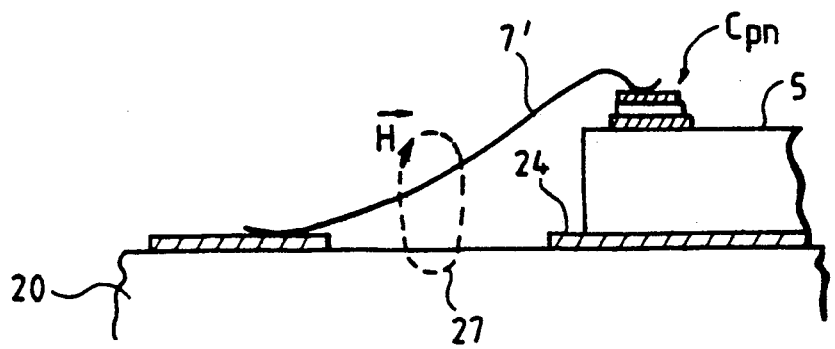
FIG. 5 is a enlarged sectional view of a detail of the device according to the invention.

FIG. 5 shows a major aspect of the invention. This FIG. 5 shows an enlarged view of a part of the section of FIG. 4. As can be seen, the wire 7' is positioned so as to be facing a part of the ferrite 20 which appears bared. This fact is important because it enables coupling between the magnetic field H created about the wire 7' (as represented by a force line 27) and the ferrite material. This coupling and the absorption that results therefrom is used to prevent any resonance from occurring in the wire 7'.

Figure 6:
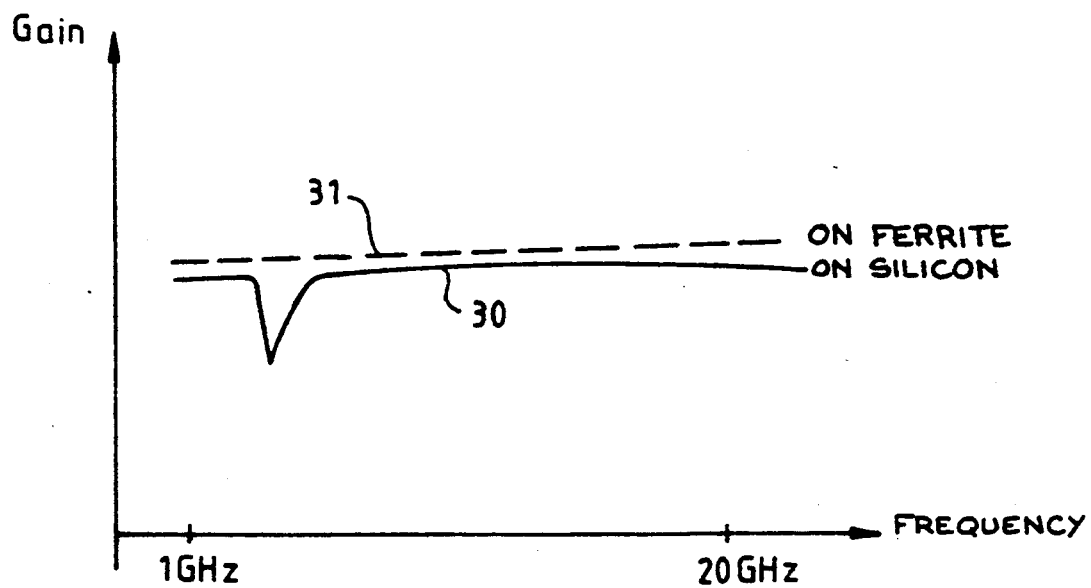
FIG. 6 is a graph illustrating the performance characteristics of the device according to the invention.

FIG. 6 illustrates the performance characteristics obtained. The curve 30 shows the variation of the gain as a function of the frequency in a piece of equipment according to the prior art and the curve 31 shows the variation of the gain for the same equipment but with a ferrite support according to the invention.

It is seen, in this way, the troublesome parasitic resonances have been eliminated on a very wide band going down to well below 3 GHz.

Of course, the exemplary embodiment described in no way restricts the scope of the invention.

What is claimed is:

1. A device for the mounting of chips of very wideband microwave monolithic integrated circuits comprising capacitors for the decoupling of the DC supplied of said circuits, said device comprising:

a ferrite support on which said chips are fixed; and
   connection means to connect said capacitors to said supplied including metallized connection zones on said support and linking wires connecting said zones to said decoupling capacitors and being positioned so as to face bared parts of said ferrite support.

2. A device for the mounting of chips of very wideband microwave monolithic integrated circuits comprising capacitors for the decoupling of the DC supplied of said circuits, said device comprising:

a ferrite support on which said chips are fixed; and
   connection means to connect said capacitors to said supplies including metallized connection zones on said support and linking wires connecting said zones to said decoupling capacitors and being positioned so as to face bared parts of said ferrite support,
   wherein said ferrite support comprises, on a first face, a uniform metallization to form a general ground plane and, on the opposite face, a plurality of metallization zones, certain of which act as ground planes for the chips that are attached thereto and are connected to said general ground plane by at least a metallized hole going through the ferrite support and the others of which constitute said metallized connections zones.

3. A device according to claim 2, wherein said ferrite is a pure nickel ferrite with low permeability.

* * * * *